United States Patent
Park et al.

(10) Patent No.: US 7,629,222 B2
(45) Date of Patent: Dec. 8, 2009

(54) METHOD OF FABRICATING A SEMICONDUCTOR DEVICE

(75) Inventors: Kang-wook Park, Seoul (KR); Hyung-moo Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/651,523

(22) Filed: Jan. 10, 2007

(65) Prior Publication Data
US 2007/0202656 A1    Aug. 30, 2007

(30) Foreign Application Priority Data
Jan. 11, 2006    (KR) .................... 10-2006-0003270

(51) Int. Cl.
*H01L 21/331* (2006.01)
*H01L 21/461* (2006.01)

(52) U.S. Cl. ............... 438/396; 438/733; 257/E21.008; 257/E21.017

(58) Field of Classification Search ......... 438/393–399; 257/E21.008, E21.017
See application file for complete search history.

(56) References Cited

U.S. PATENT DOCUMENTS

| | | | | |
|---|---|---|---|---|
| 6,319,767 B1 * | 11/2001 | Cha et al. | ................... | 438/250 |
| 6,924,207 B2 * | 8/2005 | Son et al. | ................... | 438/396 |
| 2004/0014248 A1 * | 1/2004 | Kim | ............................ | 438/3 |
| 2004/0041231 A1 * | 3/2004 | Koido et al. | ................ | 257/510 |
| 2004/0201057 A1 * | 10/2004 | Lien et al. | ................... | 257/306 |
| 2005/0051793 A1 * | 3/2005 | Ishida et al. | ............... | 257/119 |
| 2005/0062130 A1 * | 3/2005 | Ciancio et al. | ............. | 257/532 |
| 2005/0070031 A1 * | 3/2005 | Imai et al. | ...................... | 438/3 |
| 2005/0161720 A1 * | 7/2005 | Park | .......................... | 257/296 |
| 2006/0197090 A1 * | 9/2006 | Huang et al. | .................. | 257/68 |

* cited by examiner

*Primary Examiner*—Hsien-ming Lee
*Assistant Examiner*—Kevin Parendo
(74) *Attorney, Agent, or Firm*—Lee & Morse, P.C.

(57) ABSTRACT

A method of fabricating a semiconductor device includes forming a first electrode, sequentially forming a first dielectric film, a conductive film for a second electrode, a second dielectric film, and a conductive film for a third electrode above the first electrode, forming a first pattern on the conductive film for a third electrode, the first pattern defining a second electrode, forming the second electrode by sequentially patterning the conductive film for the third electrode, the second dielectric film, and the conductive film for the second electrode, using the first pattern as an etching mask, partially removing the first pattern to form a second pattern that defines a third electrode, and forming the third electrode by patterning the conductive film for the third electrode, using the second pattern as an etching mask, wherein the third electrode has a width less than that of the second electrode.

17 Claims, 7 Drawing Sheets

METHOD OF FABRICATING A SEMICONDUCTOR DEVICE

BACKGROUND OF THE INVENTION

1. Field of the Invention

The present invention relates to a method of fabricating a semiconductor device. More particularly, the present invention relates to a method of fabricating a semiconductor device including a metal-insulator-metal capacitor.

2. Description of the Related Art

Capacitors may be classified according to their junction structure, and may include metal-oxide-silicon (MOS) capacitors, p-n junction capacitors, polysilicon-insulator-polysilicon (PIP) capacitors, metal-insulator-metal (MIM) capacitors, and others. Apart from the MIM capacitors, these capacitors may use monocrystalline silicon or polycrystalline silicon as an electrode material on at least one side of the capacitor dielectric. However, monocrystalline silicon and polycrystalline silicon may exhibit a relatively high resistance when used as capacitor electrodes. Further, a depletion region may be generated when a bias voltage is applied to monocrystalline silicon or polycrystalline silicon electrodes, which may make the voltage unstable such that capacitance values cannot be maintained constant.

Frequency dependence may be decreased by reducing the resistance of capacitor electrodes, as in the case of the metal electrodes used in MIM capacitors. MIM capacitors, which exhibit a relatively small capacitance dependence on voltage and temperature, may be used for various kinds of analog devices, mixed-mode signal application devices, system on chip (SoC) applications, etc. The MIM capacitor has been applied to, for example, an analog capacitor or filter applied to analog or mixed-mode signal applications for wire/wireless communication devices, an RF capacitor for high frequency circuits, a capacitor for an image sensor, an LCD driver IC (LDI), etc.

As the degree of integration of semiconductor devices has increased, the demand for MIM capacitors having a high capacitance has also increased. However, typical methods of fabricating advanced MIM capacitors may require multiple masks in order to pattern the electrodes, which complicates the manufacturing process and reduces manufacturing productivity.

SUMMARY OF THE INVENTION

The present invention is therefore directed to a method of fabricating a semiconductor device, which substantially overcomes one or more of the problems due to the limitations and disadvantages of the related art.

It is therefore a feature of an embodiment of the present invention to provide a method of fabricating a semiconductor device that includes forming at least two features using a mask, a width of the mask being adjusted such that the at least two features have different widths.

It is therefore another feature of an embodiment of the present invention to provide a method of fabricating a semiconductor device that includes patterning first and second layers using a mask, reducing a size of the mask, and patterning the first layer using the reduced-size mask.

At least one of the above and other features and advantages of the present invention may be realized by providing a method of fabricating a semiconductor device, including forming a first electrode, sequentially forming a first dielectric film, a conductive film for a second electrode, a second dielectric film, and a conductive film for a third electrode above the first electrode, forming a first pattern on the conductive film for a third electrode, the first pattern defining a second electrode, forming the second electrode by sequentially patterning the conductive film for the third electrode, the second dielectric film, and the conductive film for the second electrode, using the first pattern as an etching mask, partially removing the first pattern to form a second pattern that defines a third electrode, and forming the third electrode by patterning the conductive film for the third electrode, using the second pattern as an etching mask, wherein the third electrode has a width less than that of the second electrode.

Partially removing the first pattern to form the second pattern may include at least one of ashing and isotropic etching. The first pattern may include at least one of a photoresist and an insulating material. The first pattern may include the photoresist, and partially removing the first pattern to form the second pattern may include partially ashing the photoresist. The first pattern may include the insulating material, and partially removing the first pattern to form the second pattern may include partially etching the insulating material using isotropic etching. The first pattern may include the insulating material, and the insulating material may be formed using chemical vapor deposition.

Forming the first electrode may include using a damascene process to form the first electrode before the conductive film for the second electrode is formed on the substrate. Forming the first electrode may include forming a first conductive film before the first dielectric film is formed, and patterning the first conductive film and the first dielectric film after forming the third electrode.

The method may further include forming a metal capping film between a conductive film for the first electrode and the first dielectric film, and patterning the metal capping film when forming the first electrode. The method may further include forming an insulating film on the third electrode, forming vias in the insulating film, the vias connected to the first, second and third electrodes, and forming wiring lines on the insulating film, the wiring lines connected to the vias. The method may further include forming a metal wiring line when forming the first electrode, the metal wiring line may be made from a same film as the first electrode and may be formed on a same layer as the first electrode.

At least one of the above and other features and advantages of the present invention may be realized by providing a method of fabricating a semiconductor device, including forming a lower film on a substrate, forming an upper film on the lower film, forming a mask on the upper film, wherein the mask has a first predetermined width, and extending portions of the upper and lower films extend laterally beyond the predetermined width, patterning the upper and lower films to remove the extending portions using the mask as an etching mask, forming a reduced-width mask by reducing the first predetermined width to a second predetermined width, and patterning the upper film using the reduced-width mask as an etching mask, wherein reducing the first predetermined width to the second predetermined width includes removing a first portion of the mask so as to leave a second portion of the mask, the second portion having the second predetermined width.

Removing the first portion of the mask may include at least one of ashing and isotropic etching. The mask may include at least one of a photoresist pattern and an insulating material pattern. The mask may include the photoresist pattern, and removing the first portion of the mask so as to leave the second portion of the mask includes partially ashing the mask. The mask may include the insulating material pattern, and removing the first portion of the mask so as to leave the second portion of the mask includes partially etching the mask using an isotropic etch.

The method may further include forming a first electrode and a first dielectric, the first electrode and the first dielectric being disposed between the lower film and the substrate. Forming the first electrode and the first dielectric may include forming a first conductive film and a first dielectric film on the substrate before the lower film is formed on the substrate, and patterning the first conductive film and the first dielectric film after patterning the upper film.

The lower film may be a conductive film for a second electrode and the upper film may be a conductive film for a third electrode, and the method may further include sequentially forming a conductive film for a first electrode and a first dielectric film before forming the conductive film for the second electrode, and forming a second dielectric film on the conductive film for the second electrode and under the conductive film for the third electrode. Patterning the upper and lower films to remove the extending portions may include patterning the second dielectric film.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
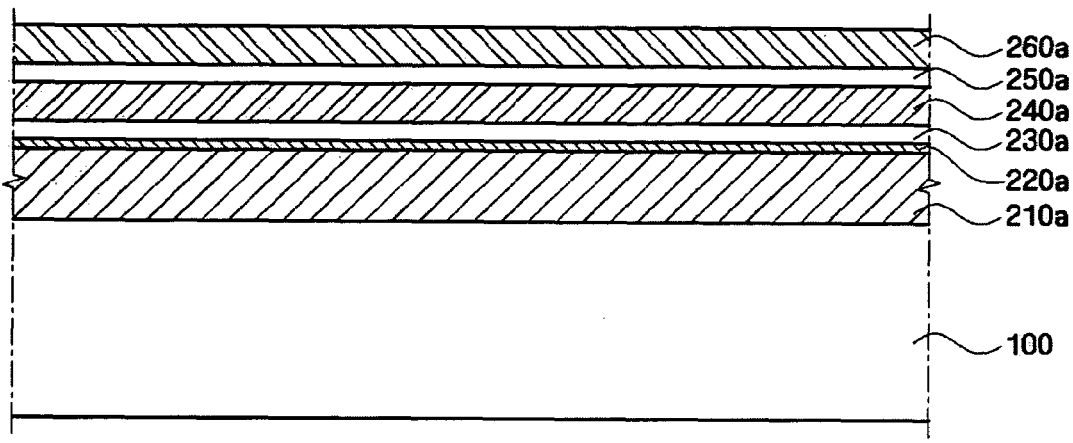
FIGS. 1A to 1G illustrate cross-sectional views of stages in a method of fabricating a semiconductor device according to a first embodiment of the present invention.

Korean Patent Application No. 10-2006-0003270, filed on Jan. 11, 2006, in the Korean Intellectual Property Office, and entitled: "Method of Fabricating Semiconductor Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be appreciated that the embodiments of the present invention are not limited by the accompanying drawings, which are merely illustrative and are not intended to reflect modifications that may be introduced by, e.g., variations in the fabrication process. For example, an etched region may be shown as having a rectangular shape, but it will be appreciated that such a region may have variations on this shape, e.g., edges that are rounded or sloped, etc. Like reference numerals refer to like elements throughout the specification.

Embodiments of the present invention provide methods for fabricating a semiconductor device that may be used to fabricate, e.g., a MIM capacitor. The capacitor may be a laminate of a plurality of capacitors, which may allow capacitance per unit area to be increased and may allow parasitic capacitance with respect to the substrate to be reduced, thereby reducing signal loss and/or improving RF characteristics of the semiconductor device. Aspects of the present invention will be described below with reference to exemplary embodiments wherein a MIM capacitor is formed having two laminated capacitors, in which three electrodes and two dielectric films are laminated. However, it will be appreciated that embodiments of the present invention are not limited thereto and may be applied to structures having various numbers of films and electrodes, as well as to other devices besides a MIM capacitor.

Hereinafter, a method of fabricating a semiconductor device according to a first embodiment of the present invention will be described with reference to FIGS. 1A to 1H. For clarity, processes that are well-known to those skilled in the art may be briefly described, so as not to obscure the description of the present invention.

Referring to FIG. 1A, a conductive film 210a for a first electrode, a first dielectric film 230a, a conductive film 240a for a second electrode, a second dielectric film 250a, and a conductive film 260a for a third electrode may be sequentially formed on a substrate. In an implementation, the films may be formed on a predetermined interlayer insulating film 100 on a semiconductor substrate. A capping film 220a, e.g., a metal film, may be formed between the conductive film 210a for a first electrode and the first dielectric film 230a.

The conductive films may be formed of a single film, e.g., Ti, TiN, TiW, Ta, TaN, W, WN, Pt, Ir, Ru, Rh, Os, Pd, and Al, etc. In another implementation, the conductive films may be a laminate of one or more of these, or other, materials. The conductive film 210a for the first electrode may be formed while a conductive film for various wiring lines is being formed. The conductive film 210a for the first electrode may be formed to a thickness of more than about 1000 Å. The conductive films 240a and 260a for the second and the third electrodes may be individually formed to a thickness of about 500 Å to about 3000 Å.

The dielectric films may be formed of a single film, e.g., a $SiO_2$ film, $Si_xN_y$ film, SiON film, $Si_xC_y$ film, $Si_xO_yN_z$ film, $Si_xO_yC_z$, $Al_xO_y$ film, $Hf_xO_y$ film, $Ta_xO_y$ film, where x, y and z are positive numbers, and/or a high dielectric film (high-k), etc. In another implementation, the dielectric films may be a laminate of one or more of these, or other, materials. The dielectric films may be formed to a thickness of about 200 Å to about 1000 Å.

The conductive and dielectric films may be formed by suitable thin film-forming processes, e.g., chemical vapor deposition (CVD), physical vapor deposition (PVD), atomic layer deposition (ALD), etc.

Figure 1B:
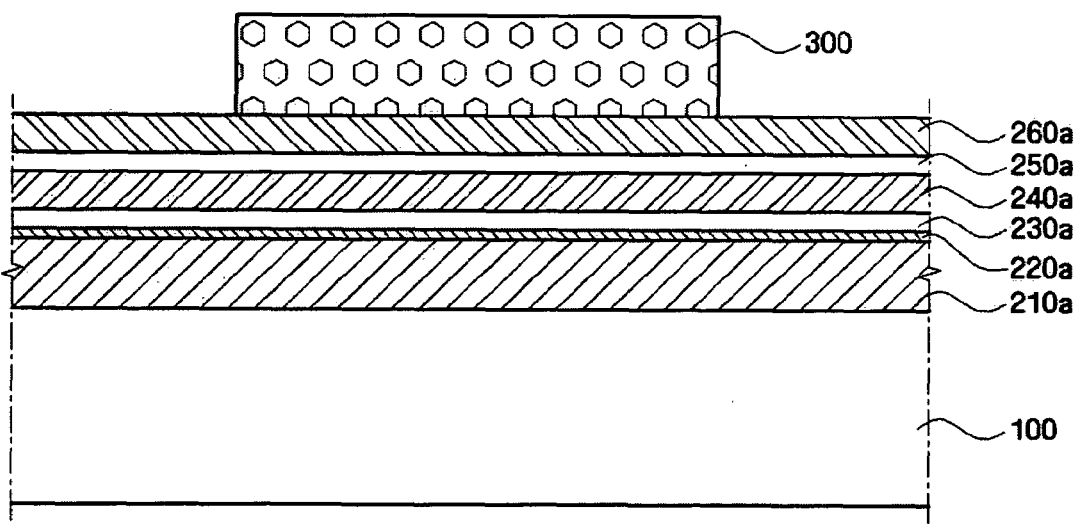

Referring to FIG. 1B, a first photoresist pattern 300 may be formed by, e.g., a lithography process. The thickness and/or material of the photoresist pattern 300 may be suitably varied as required by the particular process. The first photoresist pattern 300 may be used to define a second electrode, as described below.

Figure 1C:
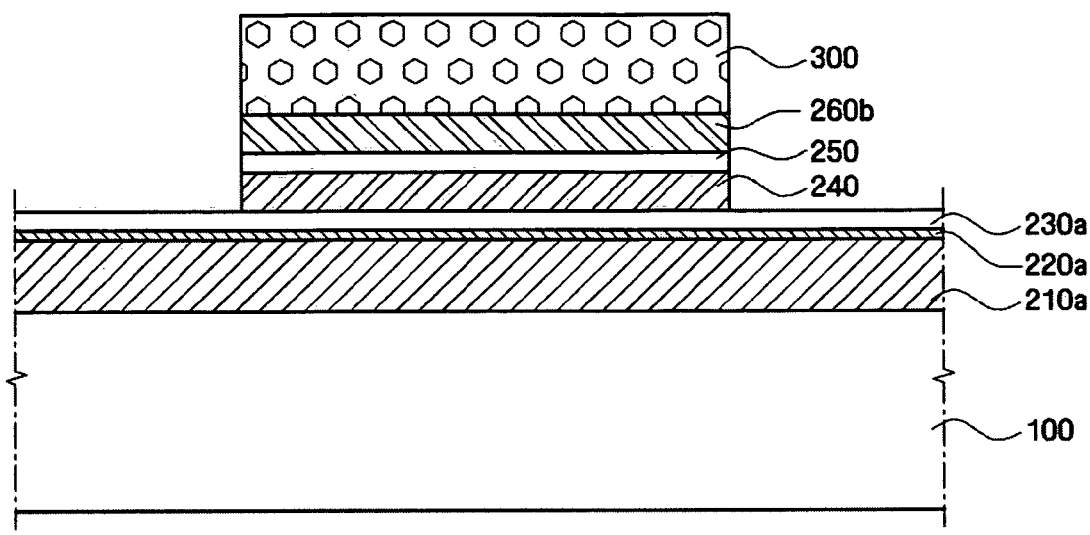

Referring to FIG. 1C, the first photoresist pattern 300 may be used as an etching mask in an etching process that sequentially patterns the conductive film 260a for a third electrode, the second dielectric film 250a, and the conductive film 240a for the second electrode, to yield the second electrode 240 having a second dielectric film 250 thereon, as well as an intermediate conductive film 260b for a third electrode.

The etching method may be, e.g., an anisotropic etching process such as a dry etching. The etching process may also partially etch the first dielectric film 230a. However, it may be desirable not to overetch the first dielectric film 230a, in order to preserve the underlying films, e.g., the conductive film 210a for the first electrode.

Figure 1D:
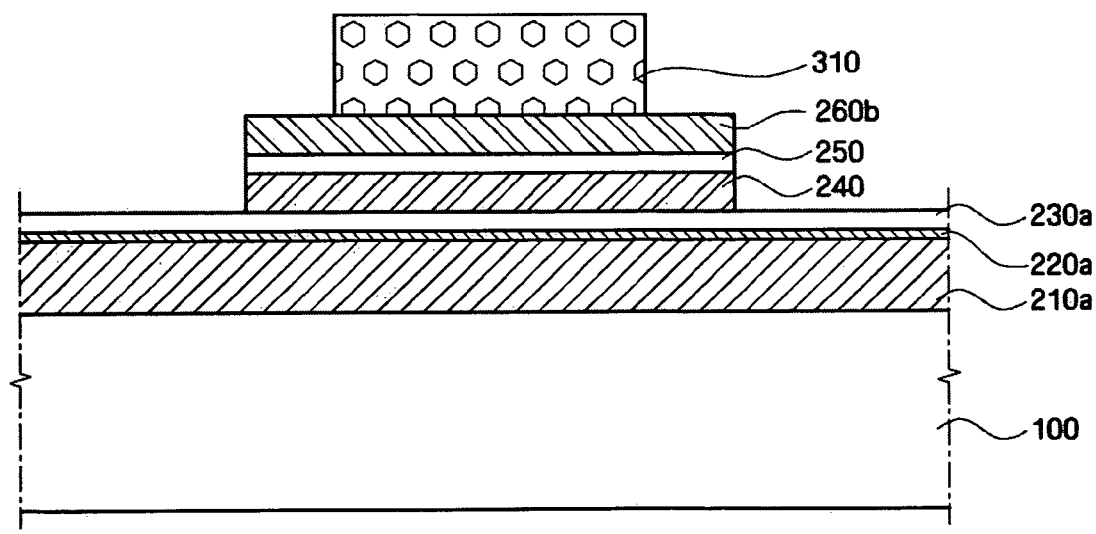

Referring to FIG. 1D, the first photoresist pattern 300 may be partially ashed to form a second photoresist pattern 310, which may be used as a mask pattern for defining a third electrode. The ashing process may be performed using, e.g., an $O_2$ plasma. The partial ashing of the first photoresist pattern 300 may remove part of the first photoresist pattern 300 while also leaving a portion thereof, i.e., leaving the second photoresist pattern 310. Ashing process conditions, e.g., time and power, may be adjusted according to the size of the remaining photoresist pattern, i.e., according to the size of the second photoresist pattern 310.

As described above, according to the first embodiment of the present invention, the size of the second photoresist pattern 310 may be determined using an ashing process, and without necessitating the use of a separate photoresist layer and mask to define the third electrode 260. That is, a single application of a photoresist layer may be used for the first photoresist pattern 300 and the second photoresist pattern 310. Thus, the manufacturing process may be simplified, e.g., by omitting a conventional lithographic process for forming a separate etching mask, and costs may be reduced and production speeds may be increased.

Figure 1E:
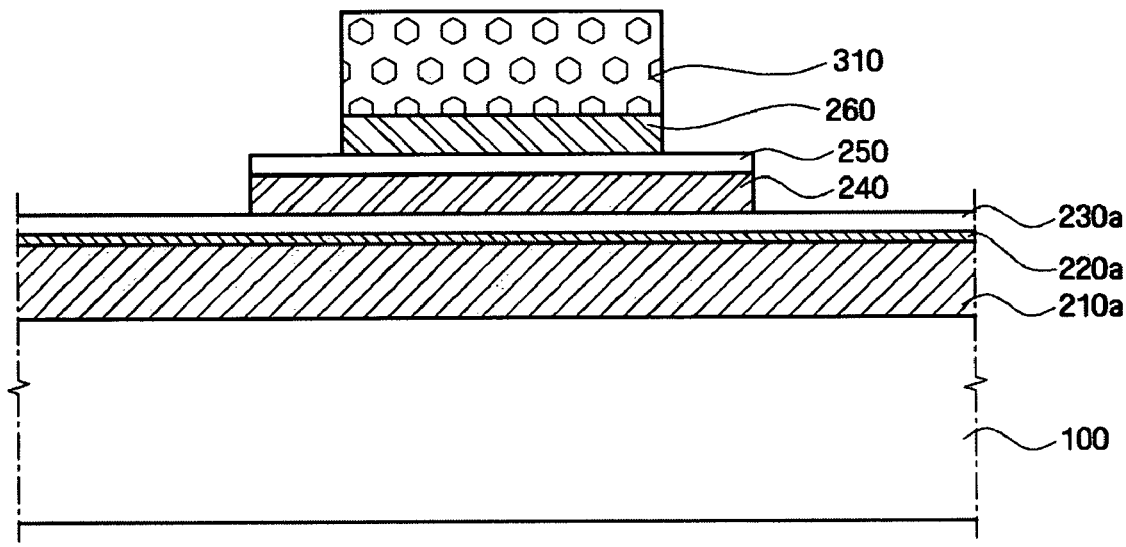

Referring to FIG. 1E, the third electrode 260 may be formed by using the second photoresist pattern 310 as an etching mask to pattern the intermediate conductive film 260b for the third electrode. The patterning of the intermediate conductive film 260b may include, e.g., an anisotropic etch such as dry etching.

The second photoresist pattern 310 may have a width that is less than that of the first photoresist pattern 300 that was used to form the second electrode 240. Accordingly, the third electrode 260 may have a width that is less than that of the second electrode 240.

At this time, the peripheral portion of the second dielectric film 250 exposed by the second photoresist pattern 310 may also be etched. However, it may be desirable to preserve the second dielectric film 250, in order to prevent the top surface of the second electrode 240 from being exposed, thus protecting the top surface of the second electrode 240.

After the formation of the third electrode 260, the second photoresist pattern 310 may be removed using, e.g., a dry method using plasma generated in an RF or microwave, a wet method using chemical solvent, etc. In another implementation, the second photoresist pattern 310 may be left in place and removed later in the fabrication process.

Figure 1F:
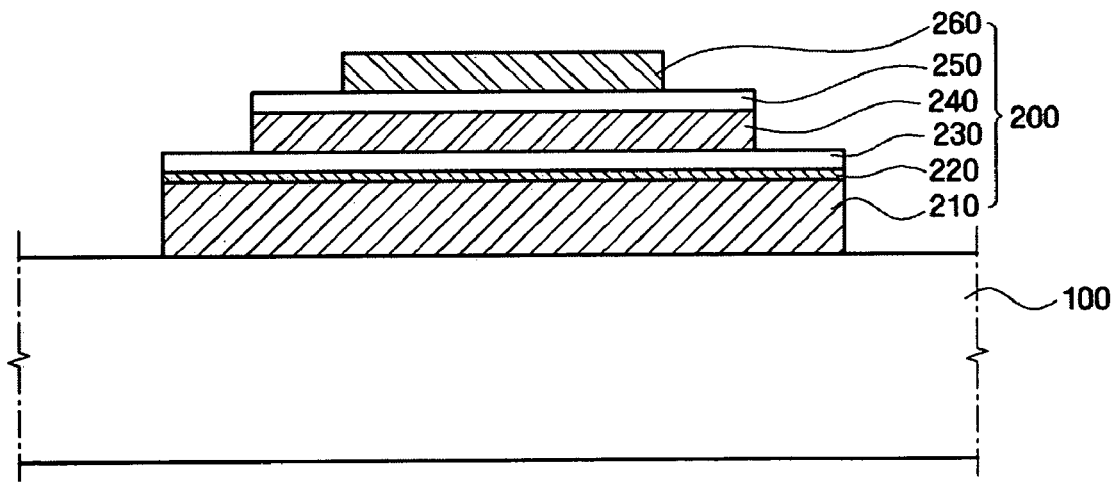

Referring to FIG. 1F, the first dielectric film 230a and the conductive film 210a for the first electrode may be patterned to form the first electrode 210, which may complete a MIM capacitor 200. In an implementation (not shown), the first dielectric film 230a and the conductive film 210a for the first electrode may be patterned using a separate mask pattern, which may then be removed.

In another implementation (not shown), the first electrode 210 may be formed by a damascene process before the first dielectric film 230a is formed on the substrate, such that the above-described patterning operation of the first electrode conductive film 210a may be omitted.

The size of the first electrode 210 may be larger than that of the second electrode 240. When the metal capping film 220a is employed between the conductive film 210a for the first electrode and the first dielectric film 230a, the metal capping film 220a may be patterned during patterning of the first dielectric film 230a and the conductive film 210a for the first electrode.

Figure 1G:
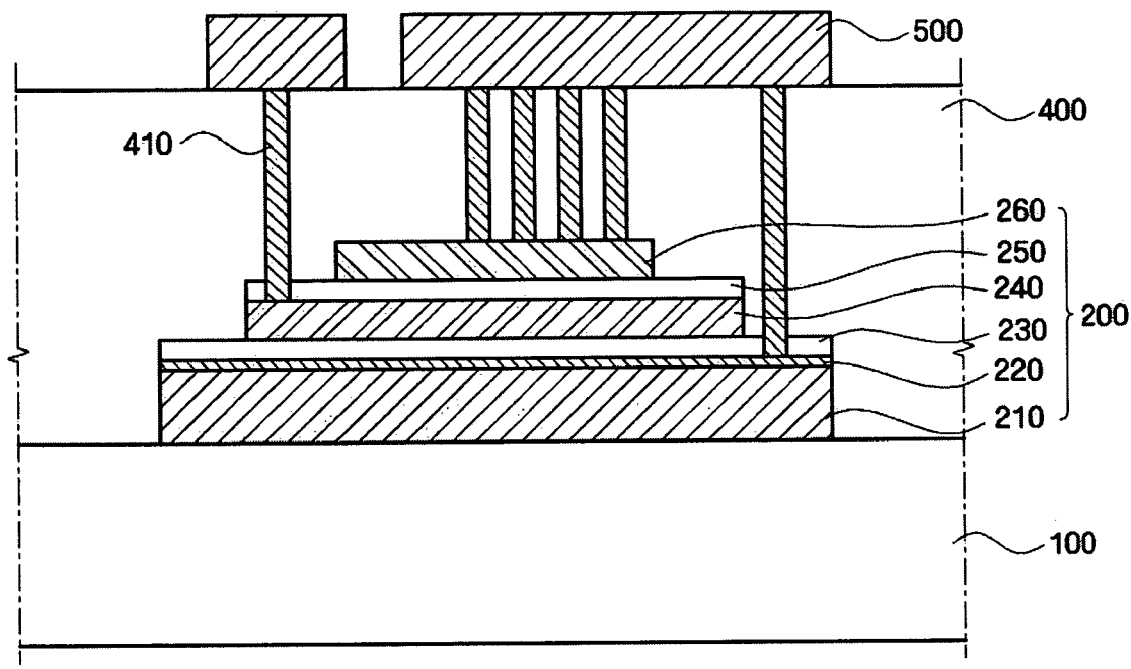

Referring to FIG. 1G, another interlayer insulating film 400 may be formed on the MIM capacitor 200 to cover the upper part of the MIM capacitor 200. In an implementation (not shown), an etch stop film, e.g., a conformal film covering an upper part and side surfaces of the capacitor 200, may be formed before the interlayer insulating film 400 is formed. Vias 410 may be formed in the interlayer insulating film 400 to connect the electrodes 210, 240 and 260 to wiring lines. The vias 410 may allow connections to predetermined wiring lines 500.

In FIG. 1G, the wiring lines 500 are illustrated as being formed on the interlayer insulating film 400, but it will be appreciated that, in other implementations, wiring lines may be formed on another layer (not shown), the wiring lines 500 may be connected to additional wiring lines formed elsewhere, etc. In an implementation (not shown), the wiring lines and/or vias may be formed using a damascene process.

Subsequently, final processing (not shown) may be performed to complete the semiconductor device. Such processing may include, e.g., forming other wiring lines, passivating the substrate, packaging the substrate, etc.

Hereinafter, a second embodiment of the present invention will be described with reference to FIGS. 2A to 2G, which illustrate cross-sectional views of stages in a method of fabricating a semiconductor device according to the second embodiment. The following description will focus on aspects that are different from those described above in connection with the first embodiment, and, in order to avoid repetition, a detailed explanation of common aspects may not be repeated.

Figure 2A:
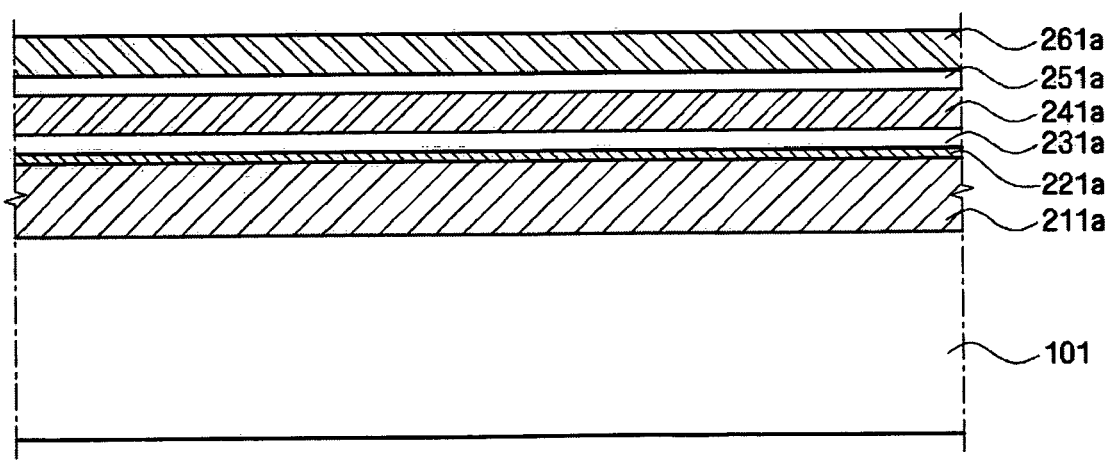
FIGS. 2A to 2G illustrate cross-sectional views of stages in a method of fabricating a semiconductor device according to a second embodiment of the present invention.

Referring to FIG. 2A, a conductive film 211a for a first electrode, a first dielectric film 231a, a conductive film 241a for a second electrode, a second dielectric film 251a and a conductive film 261a for a third electrode may be sequentially formed on an interlayer insulating film 101 formed on a semiconductor substrate. In an implementation, a capping film 221a may also be formed on the conductive film 211a for the first electrode.

Figure 2B:
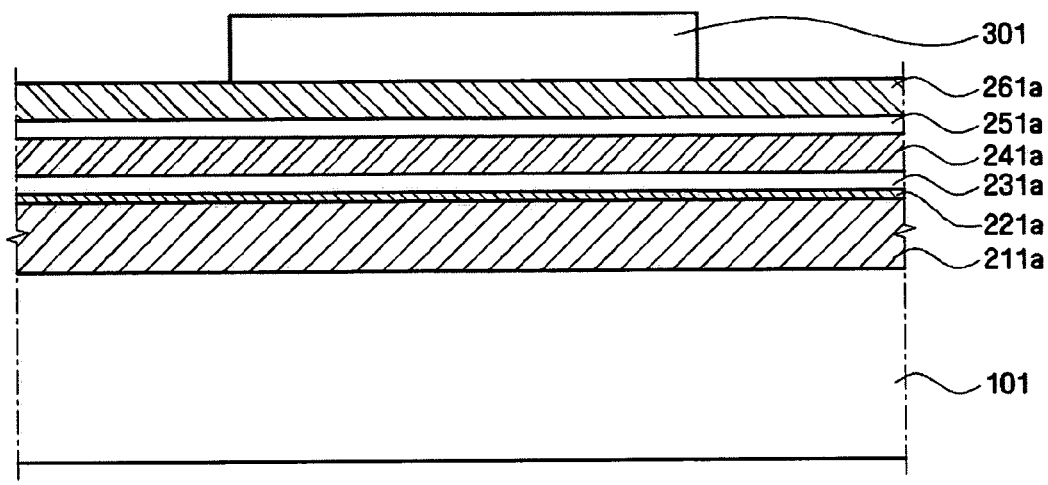

Referring to FIG. 2B, an insulating film pattern 301 may be formed on the conductive film 261a for the third electrode. The insulating film pattern 301 may be used as an etching mask during the formation of second and third electrodes. The insulating film pattern 301 may have a size corresponding to the size of the second electrode and greater than that of the third electrode. The insulating film pattern 301 may be, e.g., silicon oxide, silicon nitride, etc. The insulating film pattern 301 may be formed by, e.g., applying insulating film, e.g. by CVD, and patterning the insulating film using a predetermined photoresist pattern. The photoresist pattern may then be removed, as shown in FIG. 2B.

Figure 2C:
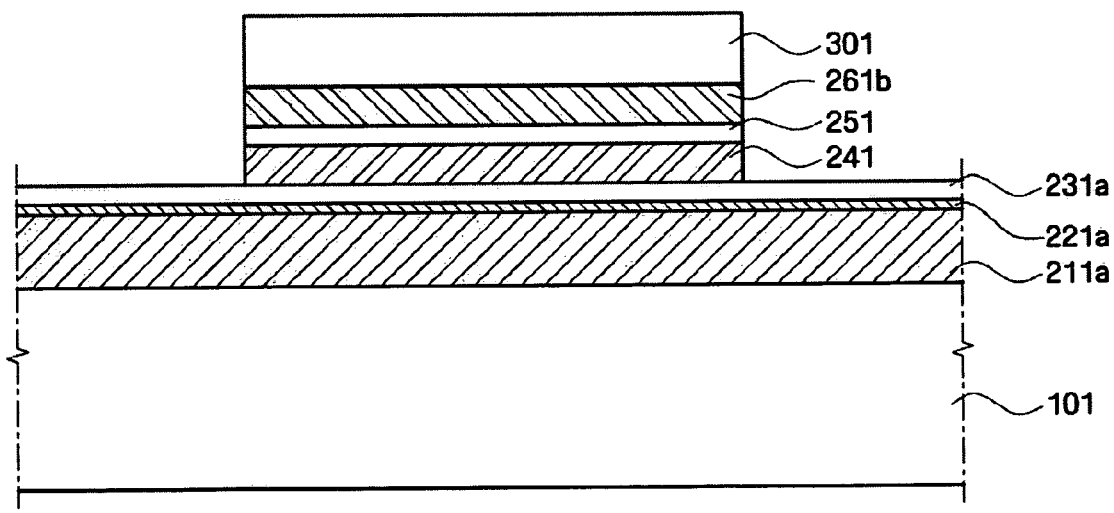

Referring to FIG. 2C, the first insulating film pattern 301 may be used as an etching mask, and the conductive film 261a for the third electrode, the second dielectric film 251a and the conductive film 241a for the second electrode may be sequentially patterned to form the second electrode 241 and a second dielectric 251, as well as an intermediate conductive film 261b for the third electrode.

Figure 2D:
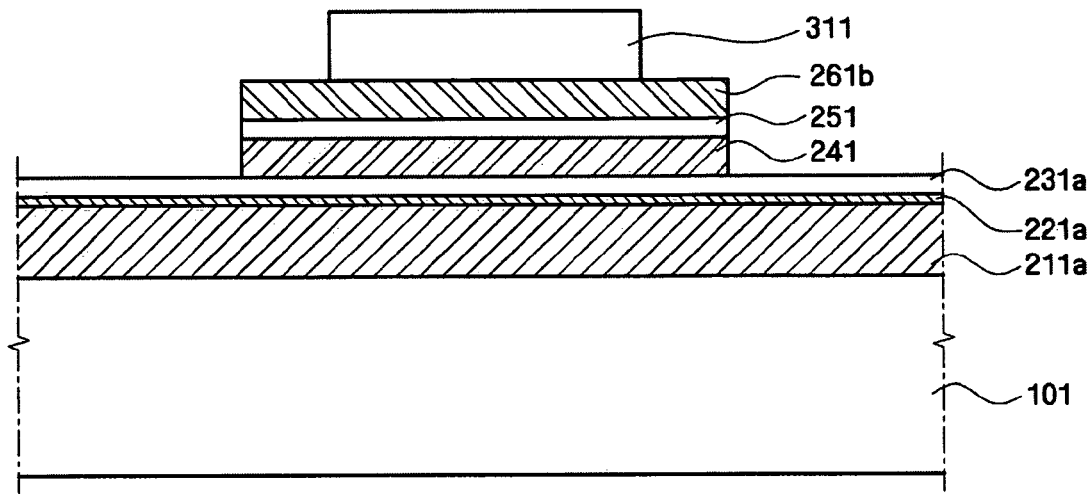

Referring to FIG. 2D, the first insulating film pattern 301 may be resized to form a second insulating film pattern 311.

The first insulating film pattern 301 may be resized by, e.g., isotropic etching of the first insulating film pattern 301. The second insulating film pattern 311 may be used as a mask pattern for defining a third electrode.

Isotropic etching of the first insulating film pattern 311 may be performed by a generally known method suitable to the particular material of the first insulating film pattern 311, e.g., dry etching.

As described above, a separate mask pattern may not be needed to form the third electrode 261. The first insulating film pattern 301 that serves as the etching mask for defining the second electrode may also be used, after being adjusted in size, as an etching mask for defining the third electrode 261.

Figure 2E:
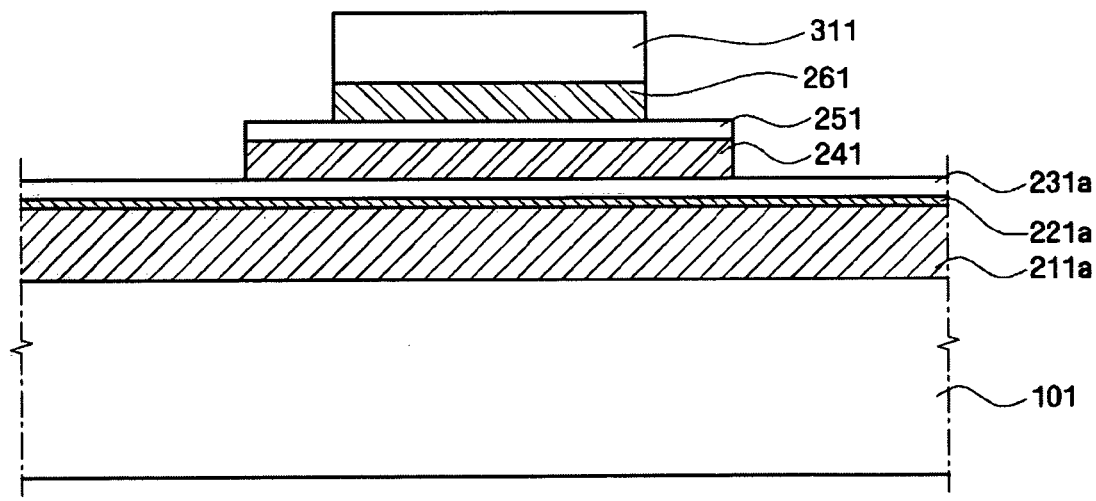

Referring to FIG. 2E, the intermediate conductive film 261b for the third electrode may be etched, using the second insulating film pattern 311 as a mask pattern, to form the third electrode 261.

Figure 2F:
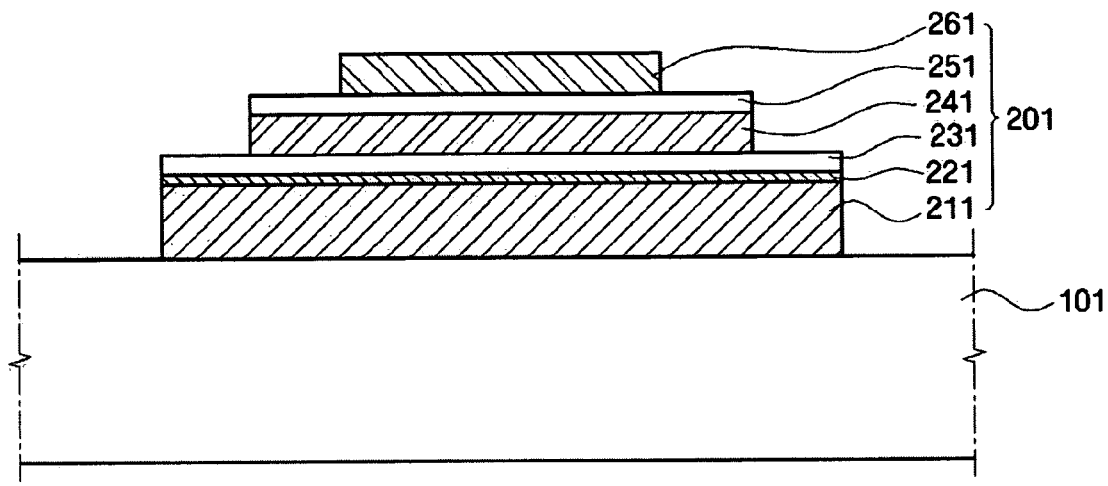

Referring to FIG. 2F, the first dielectric film 231a, the capping film 221a and the conductive film 211a for a first electrode may be sequentially patterned to form the first electrode 211, as well as the patterned capping film 221 and the first dielectric 231, which may complete the primary structure of a MIM capacitor 201.

In another implementation (not shown), the first electrode 211 may be formed by damascene process before the first dielectric film 231a is formed on the substrate, in which case the above-described patterning of the first electrode 211 may be omitted.

Figure 2G:
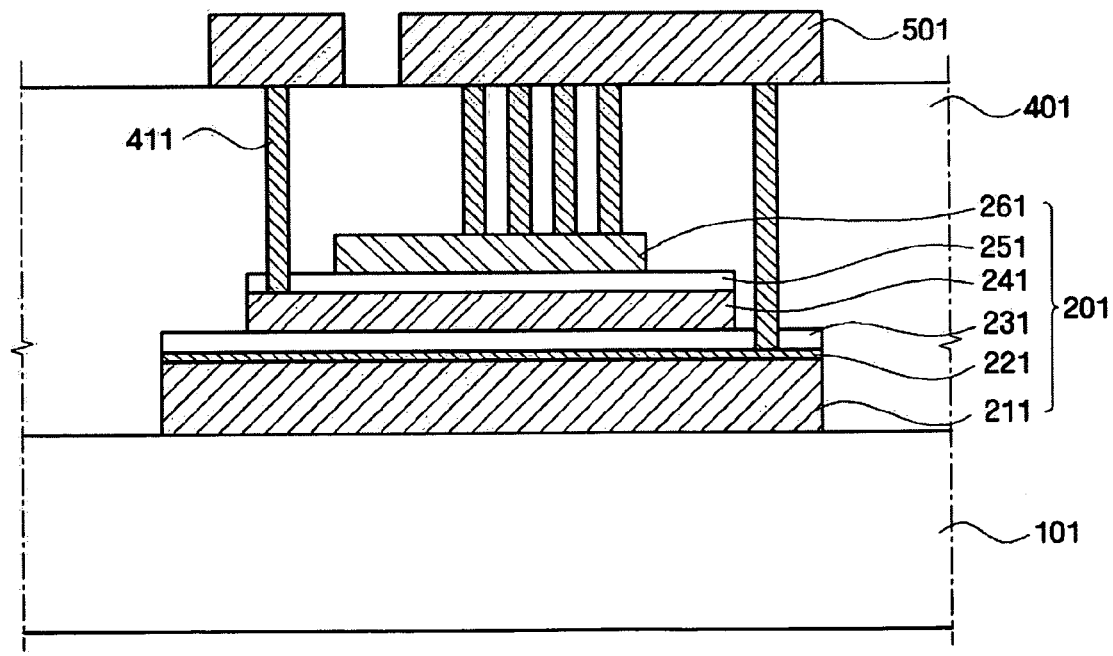

Referring to FIG. 2G, another interlayer insulating film 401 may be formed on the substrate. The interlayer insulating film 401 may cover an upper part of the MIM capacitor 201. Vias 411 connecting each electrode 211, 241 and 261 to a wiring line 501 may be formed in the interlayer insulating film 401.

As described above, a method of fabricating a semiconductor device according to embodiments of the present invention may enable the fabrication process to be simplified, which may reduce costs and may enable fabrication of a MIM capacitor having desirable operational characteristics, e.g., high capacitance. In particular, such a MIM capacitor may have enhanced capacitance per unit area.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
   forming a first electrode;
   sequentially forming a first dielectric film, a conductive film for a second electrode, a second dielectric film, and a conductive film for a third electrode above the first electrode;
   forming a first pattern on the conductive film for a third electrode, the first pattern defining the second electrode;
   forming the second electrode by sequentially patterning the conductive film for the third electrode, the second dielectric film, and the conductive film for the second electrode, using the first pattern as an etching mask;
   partially removing the first pattern to form a second pattern that defines the third electrode; and
   forming the third electrode by patterning the conductive film for the third electrode, using the second pattern as a second etching mask, wherein:
   the third electrode has a width less than that of the second electrode, and forming the third electrode includes using an anisotropic etch to pattern the conductive film for the third electrode,
   the first electrode, the first dielectric film and the second electrode form a first capacitor, and
   the second electrode, the second dielectric film and the third electrode form a second capacitor.

2. The method as claimed in claim 1, wherein partially removing the first pattern to form the second pattern includes at least one of ashing and isotropic etching.

3. The method as claimed in claim 1, wherein the first pattern includes at least one of a photoresist and an insulating material.

4. The method as claimed in claim 3, wherein the first pattern includes the photoresist, and
   partially removing the first pattern to form the second pattern includes partially ashing the photoresist.

5. The method as claimed in claim 3, wherein the first pattern includes the insulating material, and
   partially removing the first pattern to form the second pattern includes partially etching the insulating material using isotropic etching.

6. The method as claimed in claim 3, wherein the first pattern includes the insulating material, and the insulating material is formed using chemical vapor deposition.

7. The method as claimed in claim 1, wherein the first electrode is formed from a metal film, and forming the first electrode includes:
   using a damascene process to form the first electrode before the conductive film for the second electrode is formed on the substrate.

8. The method as claimed in claim 1, wherein the first electrode is formed from a metal film, and forming the first electrode includes:
   forming a first conductive metal film before the first dielectric film is formed; and
   patterning the first conductive metal film and the first dielectric film after forming the third electrode.

9. The method as claimed in claim 1, further comprising:
   forming a metal capping film between a conductive film for the first electrode and the first dielectric film; and
   patterning the metal capping film when forming the first electrode.

10. The method as claimed in claim 1, further comprising:
    forming an insulating film on the third electrode;
    forming vias in the insulating film, the vias connected to the first, second and third electrodes; and
    forming wiring lines on the insulating film, the wiring lines connected to the vias.

11. The method as claimed in claim 1, further comprising forming a metal wiring line when forming the first electrode, the metal wiring line being made from a same metal film as the first electrode and being formed on a same layer as the first electrode.

12. A method of fabricating a semiconductor device, comprising:
    sequentially forming a first conductive film for a first electrode, a first dielectric film for a first dielectric, a second conductive film for a second electrode, a second dielectric film for a second dielectric, and a third conductive film for a third electrode;
    forming a mask directly on the third conductive film, wherein the mask has a first predetermined width, and extending portions of the third conductive film, the second dielectric film, and the second conductive film extend laterally beyond the first predetermined width;

patterning the third conductive film, the second dielectric film, and the second conductive film to remove the extending portions using the mask as an etching mask;

forming a reduced-width mask by reducing the first predetermined width to a second predetermined width;

patterning the third conductive film using the reduced-width mask as a second etching mask;

patterning the first conductive film and the first dielectric film;

forming an insulating film on the patterned third conductive film;

forming vias in the insulating film, the vias connected to the patterned first, second and third conductive films; and forming wiring lines on the insulating film, the wiring lines connected to the vias, wherein:

reducing the first predetermined width to the second predetermined width includes removing a first portion of the mask so as to leave a second portion of the mask, the second portion having the second predetermined width, patterning the third conductive film includes using an anisotropic etch to pattern the third conductive film, the patterned first conductive film, the patterned first dielectric film, and the patterned second conductive film form a first capacitor, and the patterned second conductive film, the patterned second dielectric film, and the patterned third conductive film form a second capacitor.

13. The method as claimed in claim 12, wherein removing the first portion of the mask includes at least one of ashing and isotropic etching.

14. The method as claimed in claim 12, wherein the mask includes at least one of a photoresist pattern and an insulating material pattern.

15. The method as claimed in claim 14, wherein the mask includes the photoresist pattern, and removing the first portion of the mask so as to leave the second portion of the mask includes partially ashing the mask.

16. The method as claimed in claim 14, wherein the mask includes the insulating material pattern, and removing the first portion of the mask so as to leave the second portion of the mask includes partially etching the mask using an isotropic etch.

17. The method as claimed in claim 12, wherein each of the first, second, and third conductive films is formed from a metal film.

* * * * *